(12) United States Patent
Angadi

(10) Patent No.: US 11,831,461 B2
(45) Date of Patent: *Nov. 28, 2023

(54) AUTOMATIC DEVICE VOLUME ADJUSTMENT BASED ON LEARNED VOLUME PREFERENCES

(71) Applicant: Rovi Guides, Inc., San Jose, CA (US)

(72) Inventor: Deepak Angadi, Hubli-Dharwad (IN)

(73) Assignee: Rovi Guides, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/953,027

(22) Filed: Sep. 26, 2022

(65) Prior Publication Data

US 2023/0198795 A1    Jun. 22, 2023

Related U.S. Application Data

(63) Continuation of application No. 17/109,349, filed on Dec. 2, 2020, now Pat. No. 11,489,692, which is a continuation of application No. 16/986,407, filed on Aug. 6, 2020, now Pat. No. 10,887,126, which is a continuation of application No. 16/441,549, filed on Jun. 14, 2019, now Pat. No. 10,771,277.

(51) Int. Cl.
*H03G 3/32* (2006.01)
*H04L 12/28* (2006.01)
*G08C 17/02* (2006.01)

(52) U.S. Cl.
CPC .......... *H04L 12/2829* (2013.01); *G08C 17/02* (2013.01); *H03G 3/32* (2013.01); *G06F 2218/12* (2023.01); *G08C 2201/51* (2013.01)

(58) Field of Classification Search
CPC .......... H03G 3/001; H03G 3/002; H03G 1/00; H03G 3/00; H03G 3/20; H03G 3/3005; H03G 3/3089; H03G 2201/206; H03G 2201/508; H03G 2201/706
See application file for complete search history.

(56) References Cited

U.S. PATENT DOCUMENTS

| | | | |
|---|---|---|---|
| 7,761,892 B2 | 7/2010 | Ellis et al. | |
| 2016/0142821 A1* | 5/2016 | Lin | H04W 4/80 381/80 |
| 2017/0357477 A1 | 12/2017 | Im et al. | |
| 2018/0165171 A1 | 6/2018 | Vanbuskirk et al. | |
| 2018/0313944 A1 | 11/2018 | Park et al. | |
| 2020/0014983 A1* | 1/2020 | McRae | G01S 13/04 |
| 2021/0152390 A1 | 5/2021 | Angadi | |

FOREIGN PATENT DOCUMENTS

CN    107508978 A    12/2017

* cited by examiner

*Primary Examiner* — Kile O Blair
(74) *Attorney, Agent, or Firm* — Haley Guiliano LLP

(57) ABSTRACT

Systems and methods for automatically adjusting device volume based on learned volume preferences are disclosed herein. A first device receives a wireless signal from a second device. A signal strength of the wireless signal is determined, and a location of the second device is determined based on the signal strength of the wireless signal. Historical volume level data for the first device is retrieved from memory. A target volume level for the first device is determined based on the location of the second device and the historical volume level data. A volume setting of the first device is automatically adjusted to the target volume level.

20 Claims, 8 Drawing Sheets

| Device ID | Scaled/Quantized Signal Strength Range | Location | Time Interval | Target Volume Level |
|---|---|---|---|---|
| 68554 | 1 to 35 | 1 | 12:00:00 AM to 7:59:59 AM | 60 |
| 68554 | 1 to 35 | 1 | 8:00:00 AM to 3:59:59 PM | 80 |
| 68554 | 1 to 35 | 1 | 4:00:00 PM to 11:59:59 PM | 70 |
| 68554 | 35 to 70 | 2 | 12:00:00 AM to 7:59:59 AM | 55 |
| 68554 | 35 to 70 | 2 | 8:00:00 AM to 3:59:59 PM | 75 |
| 68554 | 35 to 70 | 2 | 4:00:00 PM to 11:59:59 PM | 65 |
| 68554 | 70 to 100 | 3 | 12:00:00 AM to 7:59:59 AM | 45 |
| 68554 | 70 to 100 | 3 | 8:00:00 AM to 3:59:59 PM | 65 |
| 68554 | 70 to 100 | 3 | 4:00:00 PM to 11:59:59 PM | 55 |

FIG. 7

AUTOMATIC DEVICE VOLUME ADJUSTMENT BASED ON LEARNED VOLUME PREFERENCES

CROSS-REFERENCE TO RELATED APPLICATIONS

This application is a continuation application of U.S. patent application Ser. No. 17/109,349, filed Dec. 2, 2020, which is a continuation of Ser. No. 16/986,407, filed Aug. 6, 2020, now U.S. Pat. No. 10,887,126, which is a continuation of U.S. patent application Ser. No. 16/441,549, filed Jun. 14, 2019, now U.S. Pat. No. 10,771,277, the disclosures of which are hereby incorporated by reference herein in their entireties.

BACKGROUND

The present disclosure relates to the automatic volume adjustment for devices capable of playing audio content and, more particularly, to systems and related processes for automatically adjusting the volume of a device by utilizing volume preferences learned based on volume levels used in the past for various listener locations.

SUMMARY

Televisions or other such devices are installed in a variety of environments, such as homes, restaurants, or the like, to provide audio/video content for user consumption. Each of these environments often has multiple viewing or listening areas, from which a user may consume content from such devices, with the areas having varying acoustic properties that increase or decrease the audio level perceived from the devices. Therefore, users often desire that volume level of such devices be adjusted (e.g., increased or decreased) to suit the particular area from which the user is presently consuming the content, thereby providing the user with a consistent perceived volume level across various user locations. Adjusting the volume level of conventional televisions and other such devices based on user location, however, requires user intervention, such as manual input of a volume level adjustment command via a button on a remote control or a television itself or via a voice-based user interface.

In view of the foregoing, the present disclosure provides systems and related methods that learn volume level preferences of users based on their listening location and then automatically adjust device volume based on the learned preferences, without requiring user intervention. The systems and methods described herein thus afford users a more convenient, more immersive, and richer viewing and listening experience.

In one example, the present disclosure provides a device with automatic volume adjustment based on learned volume preferences. The device includes a communication port, a memory, and control circuitry. The communication port is configured to receive a wireless signal from a second device, such as a remote control, a smart watch, a wearable electronic device, or the like. The memory is configured to store historical volume level data, which for instance, may indicate volume levels set for the device in the past during various determined user locations or locations of user devices. The control circuitry is configured to determine a signal strength of the wireless signal and then determine a location of the second device based on the determined signal strength of the wireless signal. The control circuitry retrieves the historical volume level data from the memory, determines a target volume level for the first device based on the location of the second device and the historical volume level data, and automatically adjusts a volume setting of the first device to the target volume level.

In some examples, the wireless signal is a first wireless signal, the location of the second device is a first location of the second device, and the control circuitry is further configured to receive a second wireless signal from the second device before the first wireless signal is received. The control circuitry determines a second signal strength of the second wireless signal, determines a second location of the second device based on the second signal strength of the second wireless signal, and determines the target volume level by matching the first location to the second location and, in response to matching the first location to the second location, retrieving, as the target volume level, a volume level, from among the historical volume level data, that was set for the first device when the second wireless signal was received.

In another aspect, the control circuitry is further configured to estimate a distance between the first device and the second device based on the signal strength of the wireless signal and determine the target volume level based on the estimated distance.

In a further example, the control circuitry is further configured to generate the historical volume level data by determining a plurality of locations of the second device based on respective signal strengths of additional wireless signals received at respective times, and storing in the memory a table having entries that associate the plurality of locations of the second device with respective volume levels set for the first device at the respective times. In such an example, the control circuitry may determine the target volume level based on the table.

In some aspects, the control circuitry is further configured to determine a time when the wireless signal was received from the second device; filter the table to exclude entries for locations of the second device that were determined based on the signal strengths of the additional wireless signals that were received at respective times outside a threshold of proximity to the time when the wireless signal was received; and determine the target volume level based on the filtered table.

In another example, the wireless signal is a first wireless signal, the signal strength is a first signal strength, the location is a first location of the second device, and the control circuitry is further configured to generate the historical volume level data by receiving, at the first device over a period of time, a plurality of second wireless signals from the second device; determining a plurality of second signal strengths of the plurality of second wireless signals, respectively; determining a plurality of second locations of the second device based on the plurality of second wireless signals, respectively; determining a plurality of second volume levels set for the first device when the second device was located at the plurality of second locations; and storing in the memory a table that associates the plurality of locations of the second device with the plurality of second volume levels, correspondingly. In such an example, the control circuitry may be configured to determine the target volume level by matching the first location of the second device to a location from among the plurality of second locations indicated in the table; and identifying, in the table, one of the plurality of volume levels that corresponds to the matched location.

In another aspect, the control circuitry is further configured to exclude from the historical volume level data volume levels for wireless signals that were received while a volume modification command was entered for the first device.

In yet another example, the control circuitry is further configured to classify the signal strength of the wireless signal into one of a plurality of signal strength ranges, and determine the target volume level by identifying, based on the historical volume data, a volume corresponding to the classified one of the plurality of signal strength ranges.

In some aspects, the communication port is further configured to concurrently receive a plurality of wireless signals from a plurality of second devices, respectively, and the control circuitry is further configured to determine a plurality of signal strengths of the plurality of wireless signals, respectively, and determine the location of the second device based on the plurality of signal strengths.

BRIEF DESCRIPTION OF THE DRAWINGS

The above and other objects and advantages of the disclosure will be apparent upon consideration of the following detailed description, taken in conjunction with the accompanying drawings, in which like reference characters refer to like parts throughout, and in which:

FIG. 7 depicts an additional example data structure for historical volume level data, which is employed in accordance with some embodiments of the disclosure.

DETAILED DESCRIPTION

Figure 1:
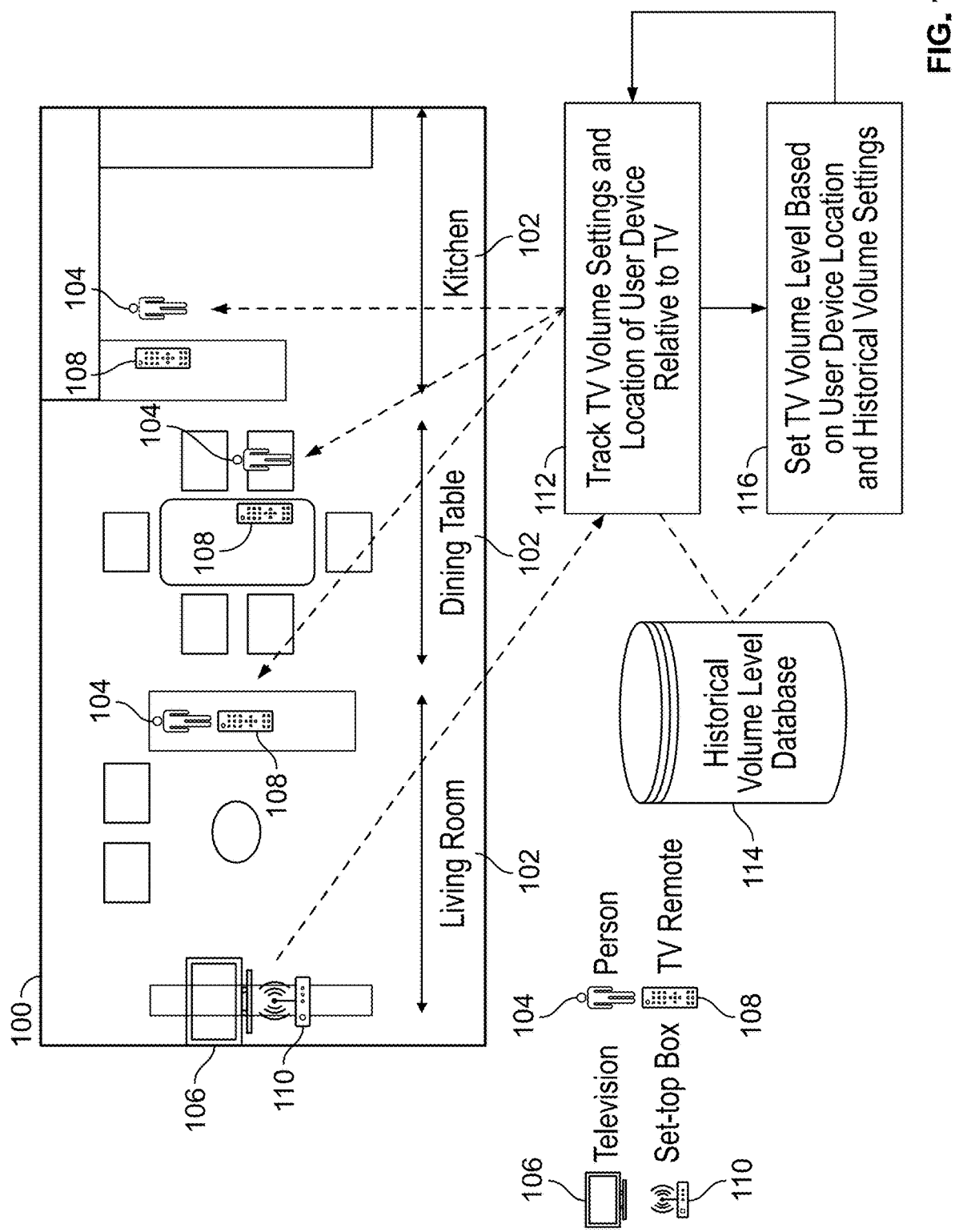
FIG. 1 shows an illustrative environment for implementation of a system for learning device volume level preferences and automatically adjusting device volume based on learned volume level preferences, in accordance with some embodiments of the disclosure.

FIG. 1 shows an illustrative environment 100 within which a system and related process for learning device volume level preferences and automatically adjusting device volume based on learned volume level preferences may be implemented, in accordance with some embodiments of the disclosure. Although FIG. 1 shows a number and configuration of individual components, in some embodiments, any number of the components shown in FIG. 1 may be combined and/or integrated as one device. The environment 100 has a floorplan with multiple viewing and/or listening areas 102 (sometimes referred to herein as locations), from which one or more users 104 may consume (e.g., view and/or listen to) content provided via a device 106 such as a television and/or any device capable of playing audio content. Areas 102 may be located at various distances from device 106 and may have varying acoustic properties that may increase or decrease the audio level that user 104 perceives from device 106 when consuming content while positioned within the respective areas. Thus, user 104 may desire that the volume level of device 106 be adjusted (e.g., increased or decreased) to suit the particular area from which the user is presently consuming the content, thereby providing user 104 with a consistent perceived volume level as the user moves to the various user areas 102.

In one aspect, the systems and related processes herein learn the users' 104 preferences as to the volume levels of device 106 when the user was located in the various areas 102 at various times and/or days of the week, and automatically adjusts the volume level of device 106 based on the learned volume level preferences, without requiring further user intervention, such as manual input of a volume level adjustment command via a button or a voice-based user interface of remote control 108, set-top box 110, or device 106. The systems and processes herein, for instance, are configured to track (112) historical data, which may include historical volume level settings set for device 106 for various locations of user 104 and/or of remote control 108 (or an Internet of Things (IoT)-enabled device, or a wearable electronic device, or the like) and/or at various times of the day and/or days of the week, store the tracked data in database 114, and automatically set or adjust (116) the volume level of device 106 based on the data stored in database 114. Additional aspects of the components and functionality of such systems and processes are described in further detail elsewhere herein.

Figure 2:
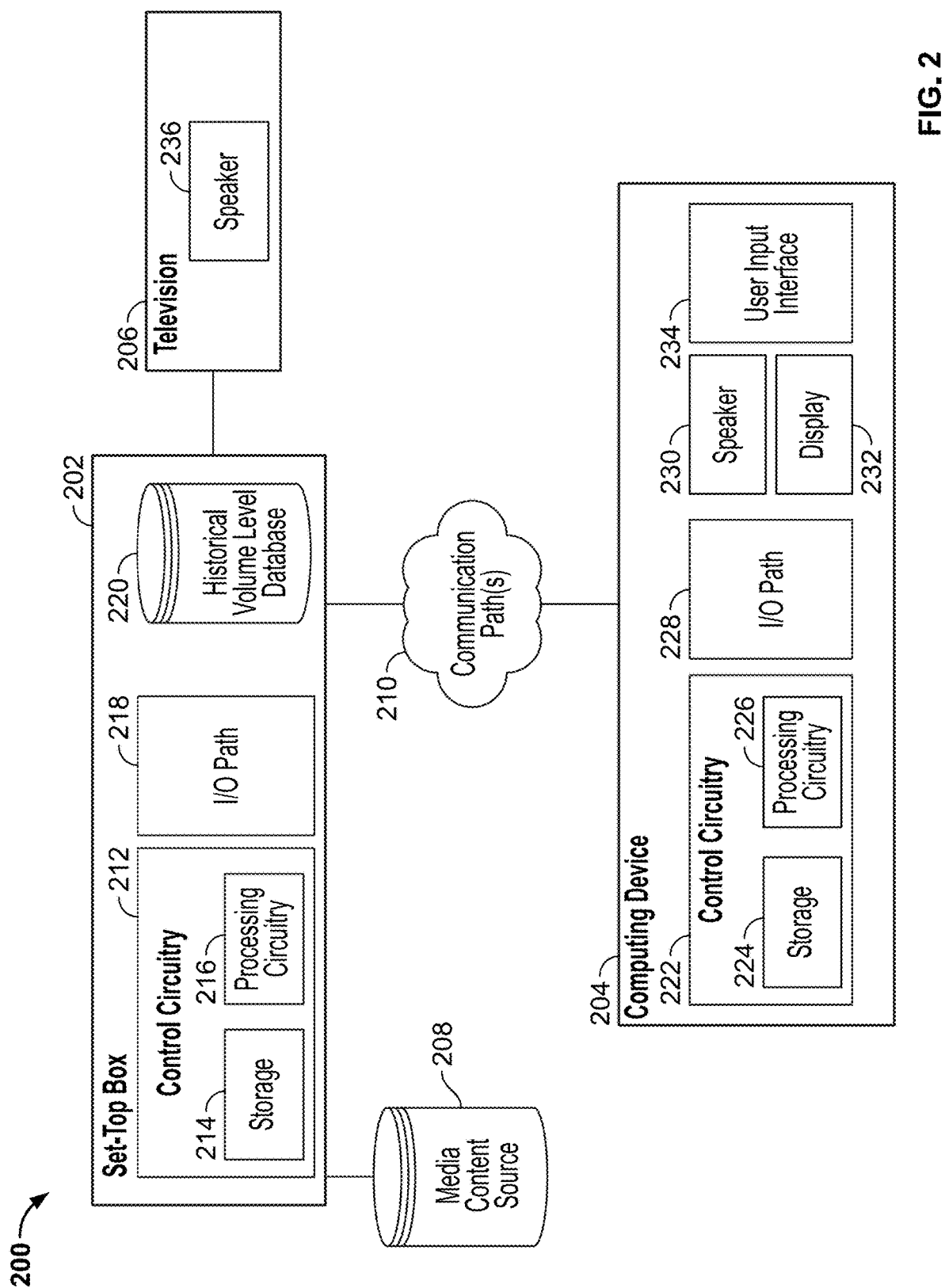
FIG. 2 is an illustrative block diagram of an example system for learning device volume level preferences and automatically adjusting device volume based on learned volume level preferences, in accordance with some embodiments of the disclosure.

FIG. 2 is an illustrative block diagram of an example system 200 for learning device volume level preferences and automatically adjusting device volume based on learned volume level preferences, in accordance with some embodiments of the disclosure. Although FIG. 2 shows certain numbers of components, in various examples, system 200 may include fewer than the illustrated components and/or multiples of one or more illustrated components. System 200 includes set-top box 202, one or more computing devices 204 (e.g., remote controls, IoT devices, wearable electronic devices, and/or the like), television 206 (or any other device capable of playing audio content via a speaker 236), and media content source 208. Set-top box 202 is communicatively coupled to television 206 via a hardwired connection or any other suitable connection. Computing devices 204 are communicatively coupled to set-top box 202 via one or more wireless communication paths 210, such as via radio frequency wireless signals, infrared signals, optical signals, or any other suitable wireless signal. Set-top box 202 includes control circuitry 212, input/output (I/O) path 218, and historical volume level database 220, and control circuitry 212 includes storage 214 and processing circuitry 216. Computing device 204 includes control circuitry 222, I/O path 228, speaker 230, display 232, and user input interface 234. Control circuitry 222 includes storage 224 and processing circuitry 226. Control circuitry 212 and/or 222 may be based on any suitable processing circuitry such as processing circuitry 216 and/or 226. As referred to herein, processing circuitry should be understood to mean circuitry based on one or more microprocessors, microcontrollers, digital signal processors, programmable logic devices, field-programmable gate arrays (FPGAs), application-specific integrated circuits (ASICs), etc., and may include a multi-core processor (e.g., dual-core, quad-core, hexa-core, or any suitable number of cores). In some embodiments, processing circuitry may be distributed across multiple separate processors, for example, multiple of the same type of processors (e.g., two Intel Core i9 processors) or multiple different processors (e.g., an Intel Core i7 processor and an Intel Core i9 processor).

Each of storage 214, storage 224, and/or storages of other components of system 200 (e.g., storages of media content source 208, television 206, and/or the like) may be an electronic storage device. As referred to herein, the phrase "electronic storage device" or "storage device" should be understood to mean any device for storing electronic data, computer software, or firmware, such as random-access memory, read-only memory, hard drives, optical drives, digital video disc (DVD) recorders, compact disc (CD) recorders, BLU-RAY disc (BD) recorders, BLU-RAY 3D disc recorders, digital video recorders (DVRs, sometimes called a personal video recorder, or PVR), solid state devices, quantum storage devices, gaming consoles, gaming media, or any other suitable fixed or removable storage devices, and/or any combination of the same. Each of storage 214, storage 224, and/or storages of other components of system 200 may be used to store various types of content, historical device volume level-related data, metadata, media guidance data, and or other types of data. Non-volatile memory may also be used (e.g., to launch a boot-up routine and other instructions). Cloud-based storage may be used to supplement storages 214, 224 or instead of storages 214, 224. In some embodiments, control circuitry 212 and/or 222 executes instructions for an application stored in memory (e.g., storage 214 and/or 224). Specifically, control circuitry 212 and/or 222 may be instructed by the application to perform the functions discussed herein. In some implementations, any action performed by control circuitry 212 and/or 222 may be based on instructions received from the application. For example, the application may be implemented as software or a set of executable instructions that may be stored in storage 214 and/or 224 and executed by control circuitry 212 and/or 222. In some embodiments, the application may be a client/server application where only a client application resides on computing device 204, and a server application resides on set-top box 202.

The application may be implemented using any suitable architecture. For example, it may be a stand-alone application wholly implemented on computing device 204. In such an approach, instructions of the application are stored locally (e.g., in storage 224), and data for use by the application is downloaded on a periodic basis (e.g., from an out-of-band feed, from an Internet resource, or using another suitable approach). Control circuitry 222 may retrieve instructions of the application from storage 224 and process the instructions to perform the functionality described herein. Based on the processed instructions, control circuitry 222 may determine what action to perform when input is received from user input interface 234.

In client/server-based embodiments, control circuitry 222 may include communication circuitry suitable for communicating with an application server (e.g., set-top box 202) or other networks or servers. The instructions for carrying out the functionality described herein may be stored on the application server. Communication circuitry may include a cable modem, an integrated services digital network (ISDN) modem, a digital subscriber line (DSL) modem, a telephone modem, an Ethernet card, or a wireless modem for communication with other equipment, or any other suitable communication circuitry. Such communication may involve the Internet or any other suitable communication networks or paths (e.g., communication paths 210). In another example of a client/server-based application, control circuitry 222 runs a web browser that interprets web pages provided by a remote server (e.g., set-top box 202 or a separate server). For example, the remote server may store the instructions for the application in a storage device. Computing device 204 may receive inputs from the user via user input interface 234 and transmit those inputs to the set-top box 202 for processing and adjusting volume of television 206.

A user may send instructions to control circuitry 212 and/or 222 using user input interface 234. User input interface 234 may be any suitable user interface, such as a remote control, trackball, keypad, keyboard, touchscreen, touchpad, stylus input, joystick, voice recognition interface, gaming controller, or other user input interfaces. User input interface 234 may be integrated with or combined with display 232, which may be a monitor, a television, a liquid crystal display (LCD), electronic ink display, or any other equipment suitable for displaying visual images.

Set-top box 202 and computing device 204 may receive content and data via input/output (hereinafter "I/O") path 218 and 228, respectively. For instance, I/O path 218 may include a communication port configured to receive a live content stream from a server and/or media content source 208 via a communication path, such as a network. I/O paths 218, 228 may provide content (e.g., a live stream of content, broadcast programming, on-demand programming, Internet content, content available over a local area network (LAN) or wide area network (WAN), and/or other content) and data to control circuitry 212 and ultimately to television 206 for playback. Control circuitry 212 may be used to send and receive commands, requests, and other suitable data using I/O paths 218, 228. I/O paths 218, 228 may connect control circuitry 212, 222 (and specifically processing circuitry 216, 226) to one or more communication paths 210, by which various I/O functions may be provided.

Media content source 208 may include one or more types of content distribution equipment, including television distribution facilities, cable system headends, satellite distribution facilities, programming sources (e.g., television broadcasters, such as NBC, ABC, HBO, etc.), intermediate distribution facilities and/or servers, Internet providers, on-demand media servers, and other content providers. NBC is a trademark owned by the National Broadcasting Company, Inc.; ABC is a trademark owned by the American Broadcasting Company, Inc.; and HBO is a trademark owned by the Home Box Office, Inc. Media content source 208 may be the originator of content (e.g., a television broadcaster, a Webcast provider, etc.) or may not be the originator of content (e.g., an on-demand content provider, an Internet provider of content of broadcast programs for downloading, etc.). Media content source 208 may include cable sources, satellite providers, on-demand providers, Internet providers, over-the-top content providers, or other providers of content. Media content source 208 may also include a remote media server used to store different types of content (e.g., including video content selected by a user) in a location remote from set-top box 202. Systems and methods for remote storage of content and providing remotely stored content to user equipment are discussed in greater detail in connection with Ellis et al., U.S. Pat. No. 7,761,892, issued Jul. 20, 2010, which is hereby incorporated by reference herein in its entirety.

Figure 3:
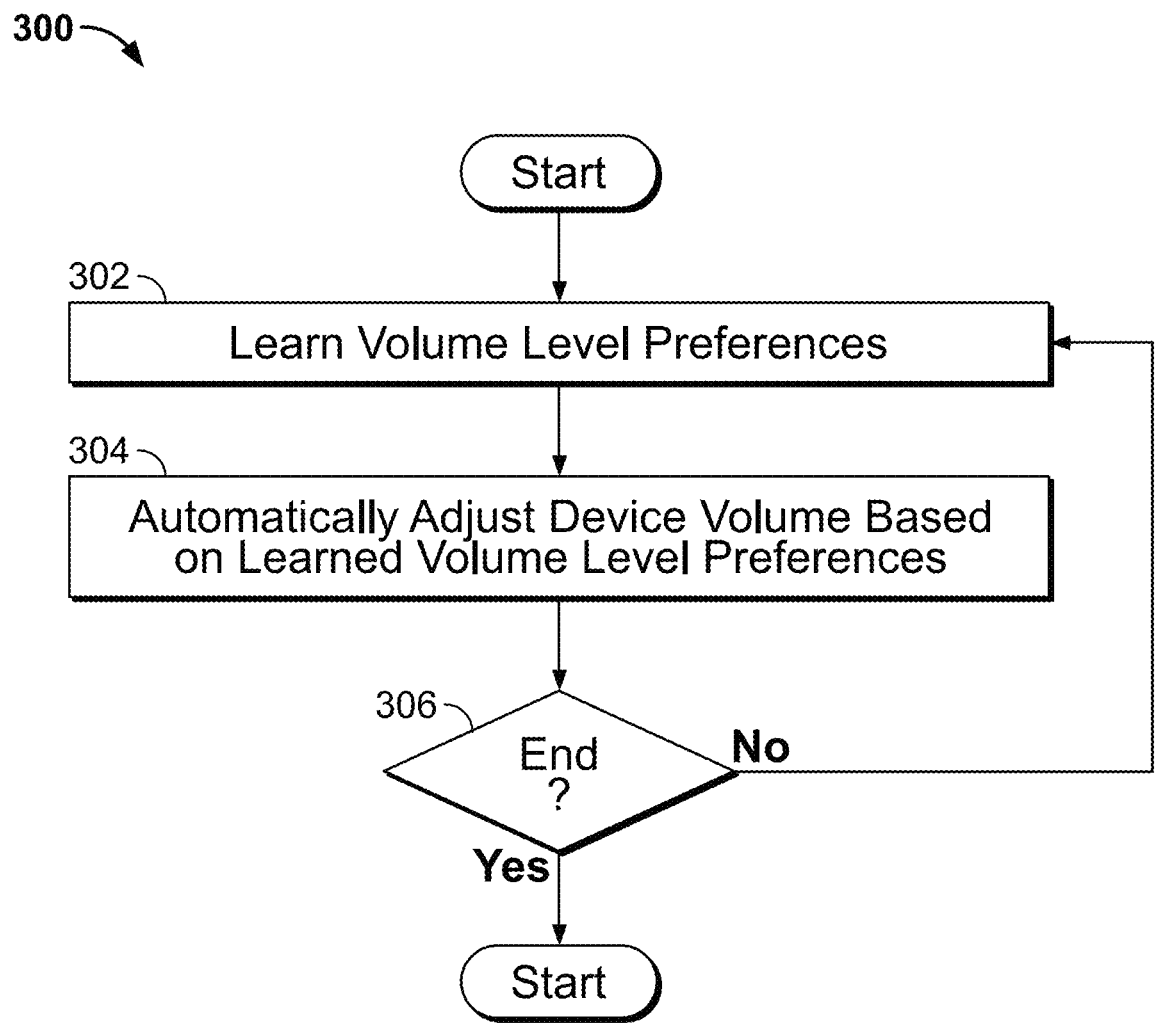
FIG. 3 depicts an illustrative flowchart of a process for learning device volume level preferences and automatically adjusting device volume based on learned volume level preferences, in accordance with some embodiments of the disclosure.

Having described system 200, reference is now made to FIG. 3, which depicts an illustrative flowchart of process 300 for learning device volume level preferences and automatically adjusting device volume based on learned volume level preferences, which may be implemented by using system 200, in accordance with some embodiments of the disclosure. In various embodiments, individual steps of process 300, or any process described herein, may be implemented by one or more components of system 200. Although the present disclosure may describe certain steps of process 300 (and of other processes described herein) as being implemented by certain components of system 200 (e.g., set-top box 202), this is for purposes of illustration only, and it should be understood that other components of system 200 (e.g., one or more remote server(s)) may implement those steps instead.

At 302, during a learning mode, control circuitry 212 conducts an algorithm to learn volume level preferences for television 206, as described in further detail below in connection with FIG. 4 through FIG. 7. At 304, during an active mode, control circuitry 212 automatically adjusts the volume level of television 206 based on the volume level preferences learned during the learning mode at 302, as described in further detail below in connection with FIG. 8. Although FIG. 3 shows active mode (302) and learning mode (304) being implemented sequentially, in various embodiments, active mode (302) and learning mode (304) may be implemented concurrently. At 306, control circuitry 212 determines whether to terminate process 300 (e.g., if a power down command was received for set-top box 202 and/or television 206). If process 300 is not to be terminated ("No" at 306), then control passes back to 302 to learn and/or update any volume level preferences for television 206 to remain adaptive to user preference changes over time. Otherwise, ("Yes" at 306), process 300 terminates.

Figure 4:
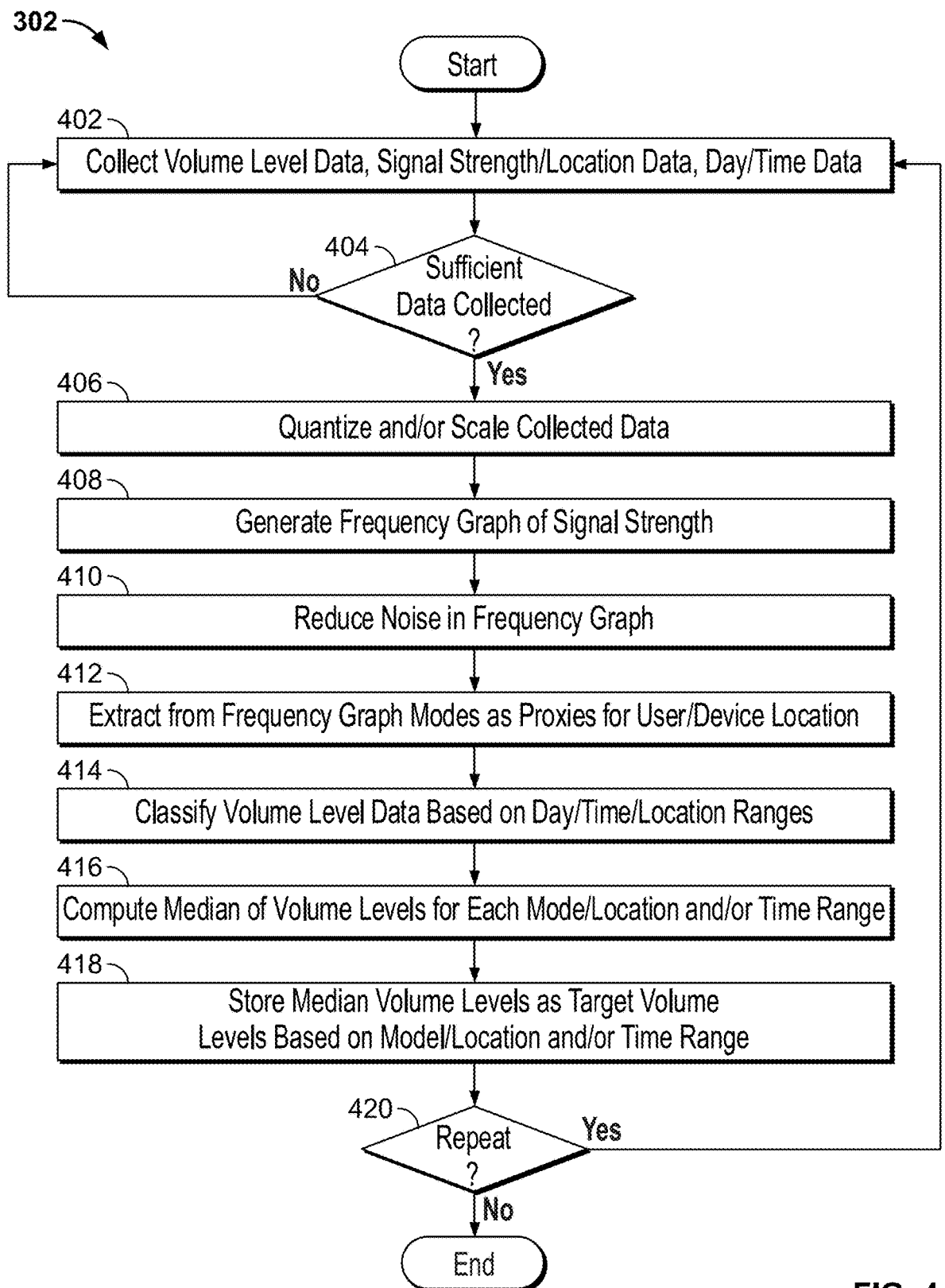
FIG. 4 depicts an illustrative flowchart of a process for learning volume level preferences, in accordance with some embodiments of the disclosure.

FIG. 4 depicts an illustrative flowchart of process 302 for learning volume level preferences, in accordance with some embodiments of the disclosure. At 402, control circuitry collects (e.g., continuously or periodically, such as once every two minutes) volume level data for television 206, signal strength data and/or location data from a wireless signal(s) received from one or more computing device(s) 204, date and/or time data from a clock (not shown in FIG. 2) implemented by set-top box 202, and/or any other type of data that may be utilized to characterize historical volume levels set for television 206 for various user locations and/or at various times of day or on various days of the week. In some embodiments, control circuitry 212 determines the signal strength levels of received wireless signals by using a signal strength detection mechanism, such as power detector circuitry and/or software. In one example, data collected at 402 includes at least volume level data of television 206, wireless signal strength data from computing device(s) 204, and timestamp data indicating time(s) and/or date(s) when respective wireless signals were captured from computing device(s) 204. In some aspects, volume level changes are stored or recorded only if such volume level changes are stable for a period of time, to avoid corrupting the volume level data with levels undesired by a user who is actively changing a volume level. Using such collected data, volume preference estimation for television 206 may be performed for single or multiple user locations and for different times of the day, as described above in connection with FIG. 1. For example, because the strength of a wireless signal is inversely proportional to the square of the distance from the source (sometimes referred to as the inverse-square law), in some aspects, control circuitry 212 uses respective signal strengths of one or more wireless signals received from one or more computing devices 204 (e.g., which may be expected to be carried by a user) to ascertain a distance of the computing devices 204 (e.g., and/or of the user) from set-top box 202 (and/or television 206) and/or a location of the computing devices 204 (e.g., and/or of the user) with respect to set-top box 202 (and/or television 206). Such locations may be determined in one spatial dimension, two spatial dimensions, three spatial dimensions, and/or four dimensions (with time as the fourth dimension). For instance, concurrently received signals from multiple computing devices 204 may be relied upon for triangulation, trilateration, and/or triangulateration to determine or estimate a location of the user relative to set-top box 202. Alternatively or additionally, in other embodiments, one or more other sensor devices such as depth sensors, two-dimensional or three-dimensional cameras, or the like may be utilized to determine user position.

At 404, control circuitry 212 determines whether sufficient data (e.g., a statistically significant amount of data) has been collected at 402. If insufficient data has been collected at 402 ("No" at 404), then control passes back to 402, at which control circuitry 212 collects additional data in the manner described above. If, on the other hand, sufficient data has been collected at 402 ("Yes" at 404), then control passes to 406. In some aspects, even after sufficient data has been collected at 402, control circuitry 212 selects for processing (as described in further detail below), from among the collected data, a latest portion of the data, such as a portion of data collected on or after a certain recent cutoff date and/or time, and excludes from processing data collected before the cutoff date and/or time, to avoid relying on out-of-date data that may have become stale over time. Alternatively, in still another aspect, control circuitry 212 selects all or some portion of the data collected at 402 for processing, and applies selective weighting to the data (for instance, by using an exponential curve that increases according to recency of collection, or by using another suitable curve) to assign a greater weight to recently collected data than to data collected longer ago.

At 406, control circuitry 212 quantizes and/or scales the various items of data that was collected at 402 and/or selected and/or weighted at 404. For example, control circuitry 212 may quantize volume levels to a scale ranging from 0 to 100, with 0 representing mute enabled. Control circuitry 212 may scale wireless signal strengths in a non-linear manner to nullify the effect of squared distances, and then quantize the scaled wireless signal strengths to a scale ranging from 0 to 100. Control circuitry 212 may convert timestamps to the time of day and then quantize the times of day to intervals of 15 or 30 minutes, in some examples.

At 408, control circuitry 212 estimates a user location distribution by generating or plotting a frequency graph of the quantized and scaled versions of the signal strength levels collected at 402 over time on a computing device 204-by-computing device 204 basis, with the plot for each computing device representing a spatial dimension in some examples. With a statistically significant number of data points, the frequency graph may resemble a uni-modal or multi-modal plot with each of the modes indicating a user location. At 410, the frequency graph is further processed by using the moving averages method to reduce or eliminate noise. The mode values, which act a proxy for user locations, are then extracted from the frequency graph at 412.

Figure 5:
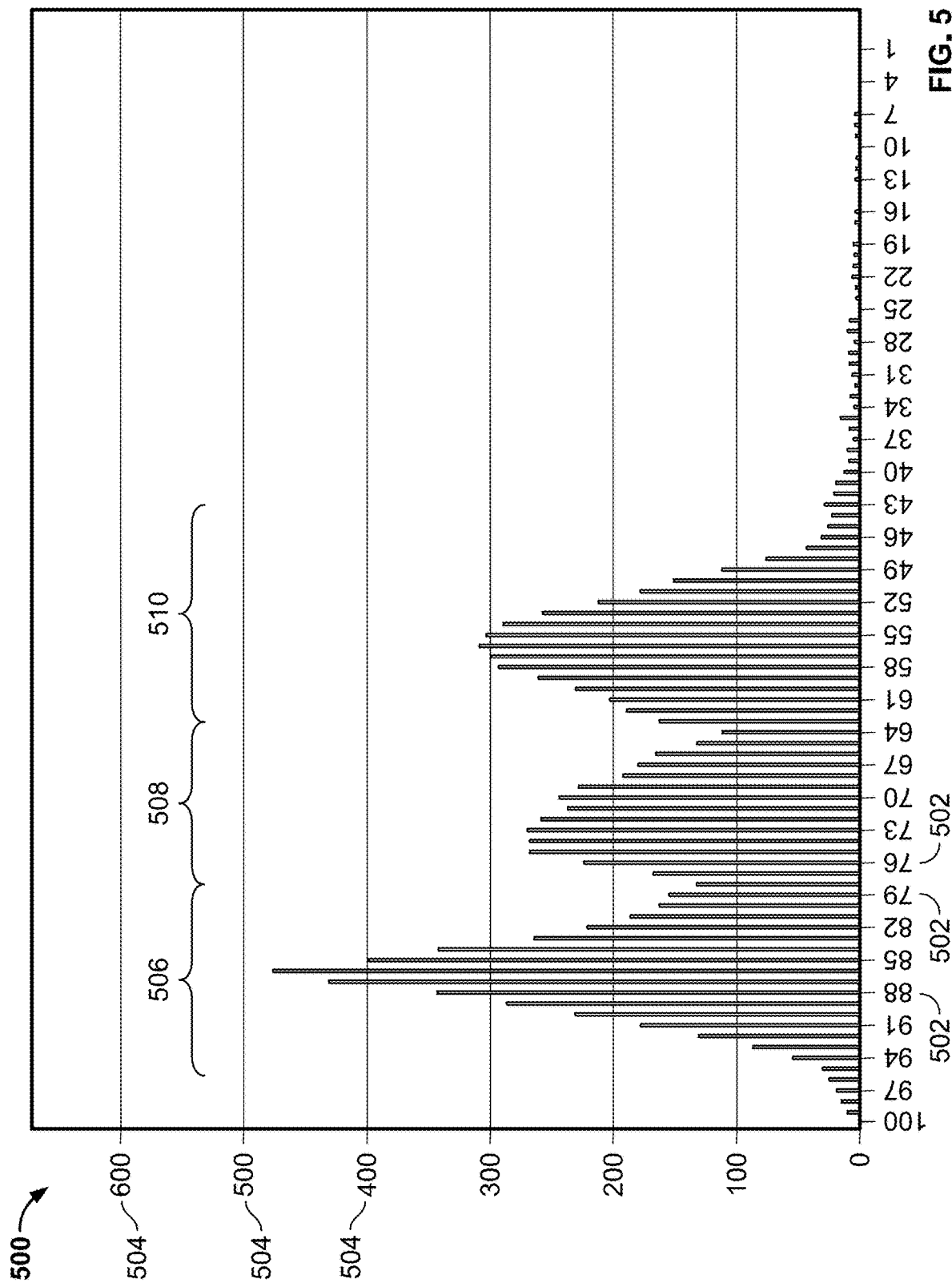
FIG. 5 depicts an example frequency graph of wireless signal strength, which is generated in accordance with some embodiments of the disclosure.

FIG. 5 depicts an example frequency graph 500 of quantized and scaled wireless signal strengths, which is generated at 408, in accordance with some embodiments of the disclosure. On its x-axis, the graph 500 includes quantized and scaled wireless signal strength values. On its y-axis, the graph 500 includes a number of instances 504 (e.g., a frequency of occurrences) that a wireless signal was received by control circuitry 212 from computing device 204 over communication path 210 having the indicated quantized and scaled wireless signal strength value. The particular graph 500 shown in FIG. 5 shows three modes 506, 508, 510, which correspond to three user locations or content consumption areas.

At 414, control circuitry 212 classifies the quantized and scaled versions of the volume data based on the mode values extracted at 412, for instance, by utilizing a nearest neighbor algorithm or the like. In some aspects, the volume data is further classified based on time of day intervals and/or days of the week, to permit filtering of the data to learn and utilize volume level preference patterns, if any, that are based on time and/or day of the week.

In some aspects, at 416, control circuitry 212 computes a median value of the scaled and quantized volume values determined for a particular user location and/or time of day interval, for effective elimination of any aberrations. The computed median volume level value is then stored at 418 in database 220 as the target volume level for a particular user location, time of day interval, and/or day of the week. At 420, control circuitry 212 determines whether the learning algorithm of process 302 is to be repeated. If so ("Yes" at 420), the control passes back to 402 to repeat the process 302 in the manner described above. If not ("No" at 420), then process 302 terminates. For instance, in some embodiments, television volume preference models may be reset in case of a layout change in a home or other content consumption environment. Such an option can be provided within a settings/configuration screen of set-top box 202. Additionally or alternatively, user volume preferences may be stored as user profiles, so each user (e.g., who may be associated with a corresponding computing device 204), may enjoy their own unique volume preferences and automatic volume adjustment. In still another aspect, control circuitry 212 may store or cache (for example, in storage 214) at least some of the intermediate computations described herein for the learning mode (for instance, results of computations previously performed in connection with prior iterations of 402 through 420 of FIG. 4) to reduce learning or retraining times for subsequent iterations of the procedures of 402 through 420 of FIG. 4.

Figure 6:
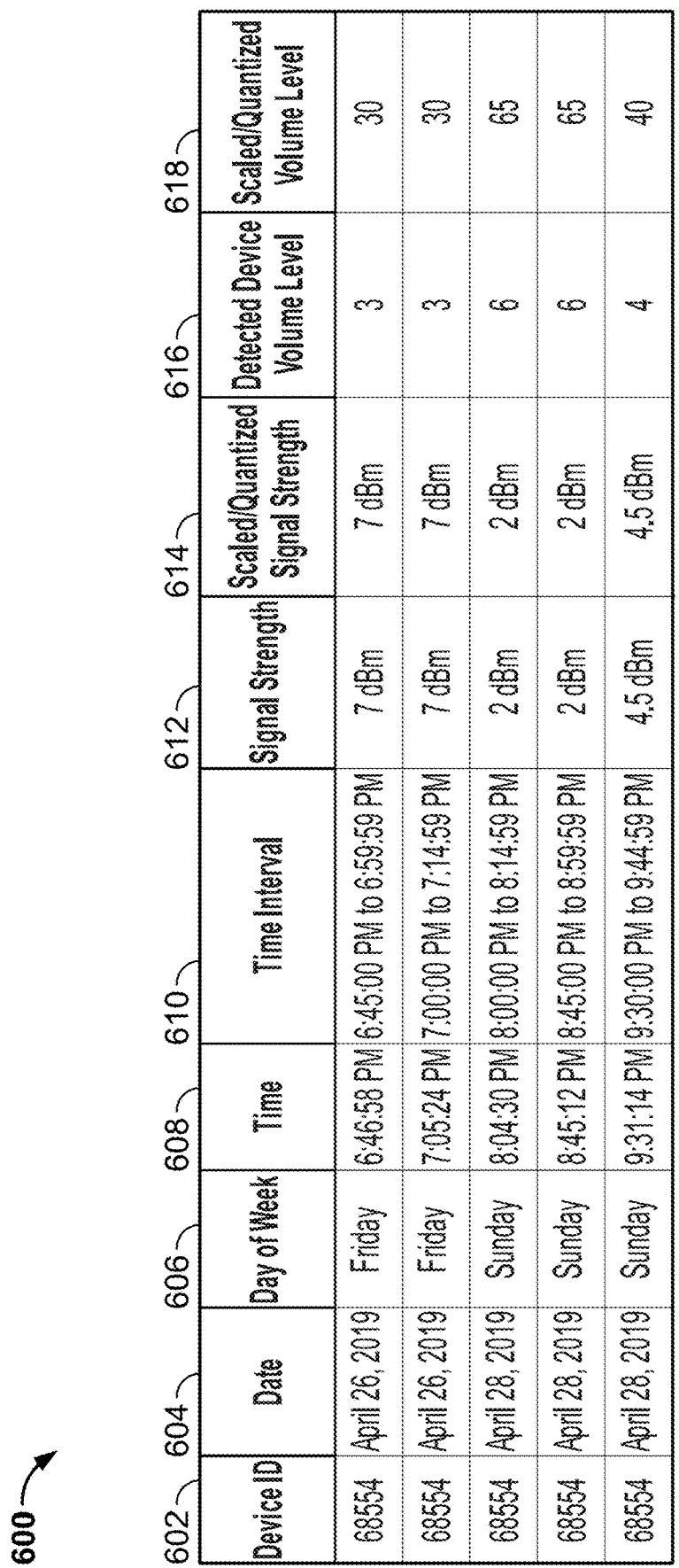
FIG. 6 depicts an example data structure for historical volume level data, which is employed in accordance with some embodiments of the disclosure.

FIG. 6 depicts an example data structure 600 for historical volume level data that may be generated according to process 302 and stored at 418, in the manner described above, in accordance with some embodiments of the disclosure. Each item of historical volume level data includes device identifier 602 that identifies the computing device 204 from which the particular wireless signal was received by control circuitry 212; date 604, day of week 606, time 608, and/or time interval 610 when the wireless signal was received from computing device 204; the raw signal strength 612 and/or scaled and quantized version of the signal strength 614 of the received wireless signal; and the raw volume level 616 and/or scaled and quantized volume level 618 set for television 206 when the wireless signal was received. FIG. 7 depicts an example data structure 700 for historical volume level data that may be generated according to process 302 and stored 418 in the manner described above, in accordance with some embodiments of the disclosure. Each item of the additional historical volume level data includes device identifier 702 that identifies the computing device 204 from which the particular wireless signal was received by control circuitry 212; scaled and quantized signal strength range 704; and a location identifier 706 (e.g., which may correspond to an index of the modes extracted at 412), time interval 708, and corresponding target volume level 710 to be used for automatic volume level adjustment for the given location 706 and/or time interval 708.

Figure 8:
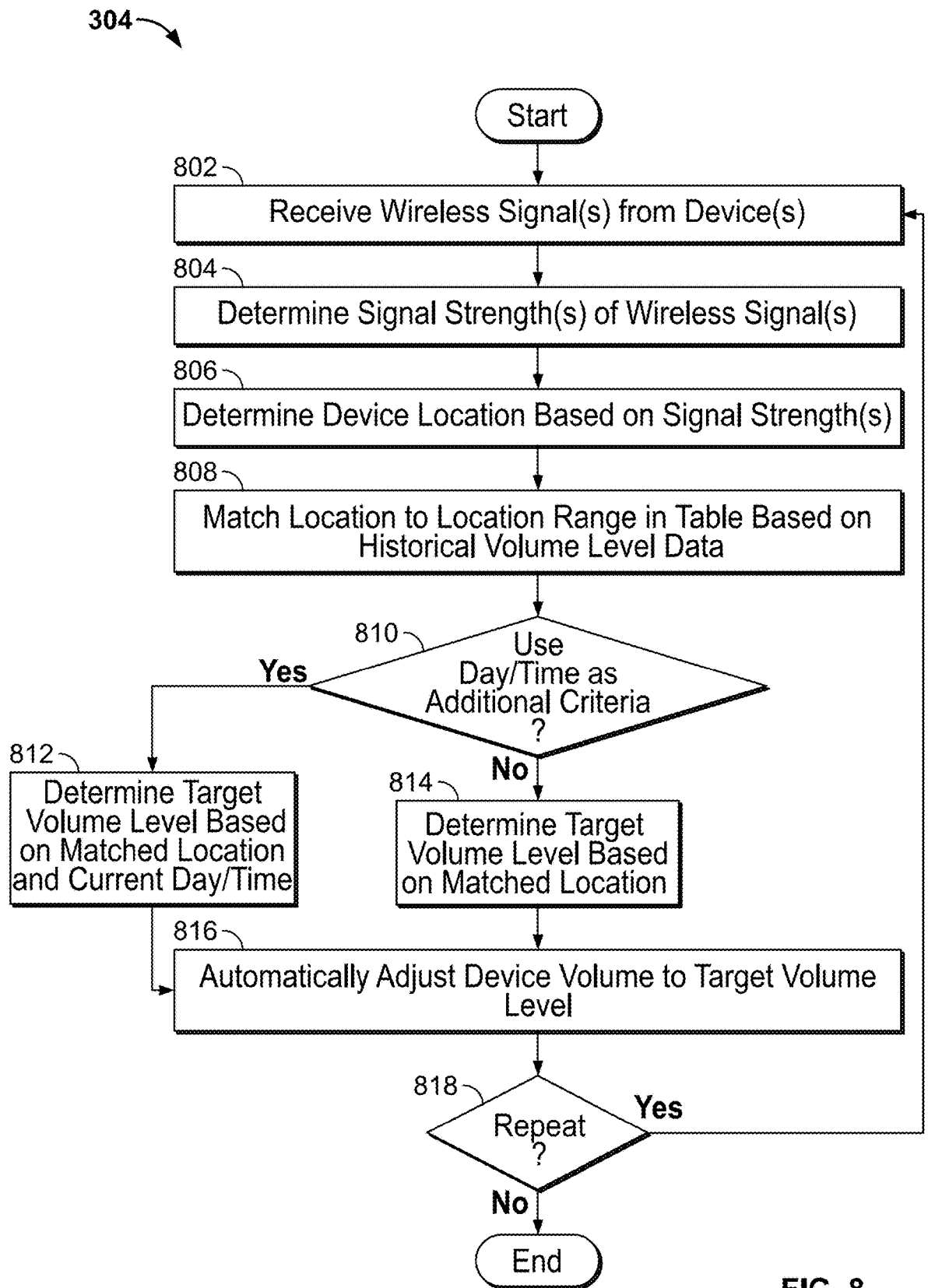
FIG. 8 depicts an illustrative flowchart of a process for automatically adjusting device volume based on learned volume level preferences, in accordance with some embodiments of the disclosure.

FIG. 8 depicts an illustrative flowchart of process 304 for automatically adjusting, during an active mode, volume of television 206 based on volume level preferences learned according to process 302, in accordance with some embodiments of the disclosure. In general, during the active mode, control circuitry 212 automatically adjusts the volume level of device 206 continuously and/or periodically based on the dynamic user location, time of day interval, and/or day information. At 802, control circuitry 212 receives one or more wireless signal(s) from one or more computing device (s) 204 over communication path(s) 210. At 804, computing device 204 determines the respective signal strengths of the wireless signals received at 802, for instance in a manner similar to that described above in connection with FIG. 4 (402). At 806, control circuitry 212 determines a location of the computing device(s) 204 (or an inferred user location) based on the signal strength(s) determined at 804. For instance, control circuitry 212 may scale and quantize the determined signal strength(s), match them to one of the scaled and quantized signal strength ranges 704 stored in database 220, and retrieve the corresponding location identifier 706 indicated in the database 220. At 808, in cases where location ranges are used instead of individual location identifiers, control circuitry 212 may match the location determined at 806 to a location 706 or location range given in the database 220.

In some embodiments, in cases where no past data or an insignificant amount of past data has been collected for particular time period (e.g., if the user is watching television at a completely different time of day), control circuitry 212 disregards the current day and/or time information and adjusts the volume considering only the determined location of the computing device(s) 204 (or the inferred user location). Accordingly, at 810, control circuitry 212 determines whether day and/or time information are to be utilized as criteria for automatic volume adjustment. If so ("Yes" at 810), then at 812 control circuitry 212 retrieves the current day and/or time information (e.g., from a clock of set-top box 202), and then determines the target volume level for television 206 based on the location determined at 806 and/or matched at 808, and by matching the current day and/or time information to the day/time information 604, 606, 608, 610, 708 stored in database 220. If not ("No" at 810), then at 814 control circuitry 212 determines the target volume level for television 206 based on the location determined at 806 without regard for the current day and/or time. At 816, control circuitry automatically sets or adjusts the volume of television 206 to the target volume level determined at 812 or 814, as the case may be.

The systems and processes discussed above are intended to be illustrative and not limiting. One skilled in the art would appreciate that the actions of the processes discussed herein may be omitted, modified, combined, and/or rearranged, and any additional actions may be performed without departing from the scope of the invention. More generally, the above disclosure is meant to be exemplary and not limiting. Only the claims that follow are meant to set bounds as to what the present disclosure includes. Furthermore, it should be noted that the features and limitations described in any one embodiment may be applied to any other embodiment herein, and flowcharts or examples relating to one embodiment may be combined with any other embodiment in a suitable manner, done in different orders, or done in parallel. In addition, the systems and methods described herein may be performed in real time. It should also be noted that the systems and/or methods described above may be applied to, or used in accordance with, other systems and/or methods.

What is claimed is:

1. A method for automatically adjusting device volume based on learned volume preferences, the method comprising:
   receiving, at a first device, a first wireless signal from a second device;
   determining a signal strength of the first wireless signal;
   classifying the signal strength into a first signal strength range of a plurality of signal strength ranges;
   determining a target volume level for the first device based on stored historical volume level data for wireless signals received in the determined first signal strength range; and
   automatically adjusting a volume setting of the first device to the target volume level.

2. The method of claim 1, further comprising estimating a distance between the first device and the second device based on the signal strength of the first wireless signal.

3. The method of claim 1, further comprising determining the first signal strength range by determining a mode signal strength of a plurality of wireless signals received from the second device.

4. The method of claim 3, further comprising:
   determining, as a first reception time, a time when the first wireless signal is received from the second device; and
   filtering out from the first signal strength range values for wireless signals that were received from the second device at times outside a time threshold with respect to the first reception time.

5. The method of claim 1, further comprising determining the target volume level according to a median volume value of the stored historical volume level data for wireless signals received in the determined first signal strength range.

6. The method of claim 1, further comprising determining the target volume level according to a median volume value of the stored historical volume level data for wireless signals received in the first signal strength range,
   wherein the stored volume level data is further classified according to a time of day interval of signal reception or according a day of the week of signal reception.

7. The method of claim 1, further comprising excluding from the historical volume level data volume levels for wireless signals received while a volume modification command was entered for the first device.

8. The method of claim 1, further comprising:
   receiving, at the first device, a second wireless signal from a third device, wherein a signal strength of the second wireless signal is identical to the signal strength of the first wireless signal; and
   determining a second target volume level for the third device, the second target volume being different from the target volume.

9. The method of claim 1, wherein the second device is at least one of a remote control, a smart watch, or a wearable electronic device.

10. A system for automatically adjusting device volume based on learned volume preferences, the system comprising:
    a memory configured to store historical volume level data; and
    control circuitry configured:
      to receive, at a first device, a first wireless signal from a second device;
      to determine a signal strength of the first wireless signal;
      to classify the signal strength into a first signal strength range of a plurality of signal strength ranges;
      to determine a target volume level for the first device based on stored historical volume level data for wireless signals received in the determined first signal strength range; and
      to adjust automatically a volume setting of the first device to the target volume level.

11. The system of claim 10, wherein the control circuitry is configured to estimate a distance between the first device and the second device based on the signal strength of the first wireless signal.

12. The system of claim 10, wherein the control circuitry is configured to determine the first signal strength range by determining a mode signal strength of a plurality of wireless signals received from the second device.

13. The system of claim 12, wherein the control circuitry is configured:
    to determine, as a first reception time, a time when the first wireless signal is received from the second device; and
    to filter out from the first signal strength range values for wireless signals that were received from the second device at times outside a time threshold with respect to the first reception time.

14. The system of claim 10, wherein the control circuitry is configured to determine the target volume level according to a median volume value of the stored historical volume level data for wireless signals received in the determined first signal strength range.

15. The system of claim 10, wherein the control circuitry is configured to determine the target volume level according to a median volume value of the stored historical volume level data for wireless signals received in the first signal strength range,
    wherein the stored volume level data is further classified according to a time of day interval of signal reception or according a day of the week of signal reception.

16. The system of claim 10, wherein the control circuitry is configured to exclude from the historical volume level data volume levels for wireless signals received while a volume modification command was entered for the first device.

17. The system of claim 10, wherein the control circuitry is configured:
    to receive, at the first device, a second wireless signal from a third device, wherein a signal strength of the second wireless signal is identical to the signal strength of the first wireless signal; and
    to determine a second target volume level for the third device, the second target volume being different from the target volume.

18. The system of claim 10, wherein the second device is at least one of a remote control, a smart watch, or a wearable electronic device.

19. A system for automatically adjusting device volume based on learned volume preferences, the system comprising:
    means for receiving, at a first device, a first wireless signal from a second device;
    means for determining a signal strength of the first wireless signal;
    means for classifying the signal strength into a first signal strength range of a plurality of signal strength ranges;

means for determining a target volume level for the first device based on stored historical volume level data for wireless signals received in the determined first signal strength range; and means for automatically adjusting a volume setting of the first device to the target volume level.

20. The system of claim 19, further comprising:

means for determining, as a first reception time, a time when the first wireless signal is received from the second device; and means for filtering out from the first signal strength range values for wireless signals that were received from the second device at times outside a time threshold with respect to the first reception time.

* * * * *